(12) United States Patent
Kuo

(10) Patent No.: US 9,466,560 B2
(45) Date of Patent: Oct. 11, 2016

(54) INTERPOSER FABRICATING PROCESS AND WAFER PACKAGING STRUCTURE

(71) Applicant: UNITED MICROELECTRONICS CORP., Hsin-Chu (TW)

(72) Inventor: Chien-Li Kuo, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 129 days.

(21) Appl. No.: 14/289,630

(22) Filed: May 28, 2014

(65) Prior Publication Data

US 2015/0348892 A1 Dec. 3, 2015

(51) Int. Cl.
| | |
|---|---|
| *H01L 23/498* | (2006.01) |
| *H01L 21/48* | (2006.01) |
| *C25D 5/02* | (2006.01) |
| *C25D 5/48* | (2006.01) |
| *C25D 5/34* | (2006.01) |
| *H01L 23/00* | (2006.01) |
| *H01L 21/56* | (2006.01) |
| *H01L 23/31* | (2006.01) |

(52) U.S. Cl.
CPC .......... *H01L 23/49822* (2013.01); *C25D 5/02* (2013.01); *C25D 5/34* (2013.01); *C25D 5/48* (2013.01); *H01L 21/4853* (2013.01); *H01L 21/4857* (2013.01); *H01L 23/49811* (2013.01); *H01L 23/49827* (2013.01); *H01L 24/96* (2013.01); *H01L 21/561* (2013.01); *H01L 23/3128* (2013.01); *H01L 23/49838* (2013.01); *H01L 2224/18* (2013.01)

(58) Field of Classification Search
CPC ............... H01L 2924/00; H01L 2924/00014; H01L 2924/10253; H01L 2924/12042; H01L 2224/451; H01L 2224/48091; H01L 23/481; H01L 24/13; H01L 2924/01029; H01L 2924/01078; H01L 2924/12043; H01L 2924/15788
USPC .......... 257/E23.021, 744, E21.508, E21.572, 257/E21.576, E21.584, E21.586, E23.011, 257/E23.078, E23.124, 678, 750, 773; 438/106, 612, 613, 614, 618, 653, 667, 438/675
See application file for complete search history.

(56) References Cited

U.S. PATENT DOCUMENTS

| | | | | |
|---|---|---|---|---|
| 5,814,889 | A * | 9/1998 | Gaul | H01L 21/763 257/750 |
| 6,197,613 | B1 * | 3/2001 | Kung | H01L 23/3107 257/E21.508 |
| 6,649,531 | B2 * | 11/2003 | Cote | H01L 21/76808 257/E21.277 |
| 8,242,616 | B1 | 8/2012 | Motohashi | |
| 9,099,396 | B2 * | 8/2015 | Wu | H01L 23/3171 |
| 2002/0171133 | A1 * | 11/2002 | Mok | G01R 1/06711 257/678 |
| 2012/0252208 | A1 * | 10/2012 | Jang | H01L 21/76883 438/653 |
| 2013/0062761 | A1 | 3/2013 | Lin | |
| 2013/0264720 | A1 * | 10/2013 | Chun | H01L 23/481 257/774 |

OTHER PUBLICATIONS

Yole Développement Company, 3D Integration Infrastructure & Market Status, 2010.

* cited by examiner

*Primary Examiner* — Stephen W Smoot
*Assistant Examiner* — Edward Chin
(74) *Attorney, Agent, or Firm* — Winston Hsu; Scott Margo

(57) ABSTRACT

An interposer fabricating process includes the following steps. A substrate, an oxide layer, and a dielectric layer are stacked from bottom to top, and an interconnect in the dielectric layer is provided, wherein the dielectric layer includes a stop layer contacting the oxide layer and the interconnect includes a metal structure having a barrier layer protruding from the stop layer. The substrate and the oxide layer are removed until exposing the stop layer and the barrier layer by a removing selectivity between the oxide layer and the stop layer. A wafer packaging structure formed by said interposer is also provided.

7 Claims, 10 Drawing Sheets

… (1) …

INTERPOSER FABRICATING PROCESS AND WAFER PACKAGING STRUCTURE

BACKGROUND OF THE INVENTION

1. Field of the Invention

The present invention relates generally to an interposer fabricating process and a wafer packaging structure, and more specifically to an interposer fabricating process and a wafer packaging structure formed by the interposer without through silicon vias and adhesive.

2. Description of the Prior Art

As the technology of semiconductor fabrication grows more advanced, relevant techniques have to be developed to fulfill the requirements of the semiconductor devices. The fabrication process of a semiconductor device typically includes three stages. In the first stage, an epitaxy technique may be used for the formation of a semiconductor substrate. Semiconductor devices such as metal-oxide semiconductor (MOS) and multilevel interconnection are fabricated on the substrate in the second stage.

The third stage is the packaging process. It is now a leading trend to fabricate a device or an electronic product with a thin, light, and small dimension; that is, with a higher integration for semiconductor devices. In terms of packages, many techniques such as chip scale package and multi-chip module (MCM) have been developed to obtain this high integration. The development of a fabrication technique with a line width of 0.18 µm has evoked a great interest, and led to intensive research to further decrease the package volume. It is one of the most important package techniques that can arrange more than one chip into a single package. In a multi-chip package, chips of the processor, memory (including dynamic random access memory (DRAM) and flash memory), and logic circuit can be packed together in a single package, which reduces both the fabrication cost and the packaging volume. The signal transmission path is shortened to enhance the efficiency. The multi-chip IC packaging technology can be applied to a multi-chip system with variable functions and operation frequencies.

There are many styles of packaging, such as flip chip bonding, wire bonding, flip chip combining wire bonding or utilizing interposers. In current processes, packaging by interposers is widely used, wherein TSV (through silicon via) structures are used in the interposers for interconnections between dies or between a die and the substrate to provide electrical connection of the components on each level. This technique can provide a relatively high routing density and very fine pitch with good electrical performance. Interposers utilizing TSV and adhesive for physically connecting these components need complex processes, however, which can cause defects. This may lead to unpredictable problems in a formed device, which decreases the reliability of its performance.

SUMMARY OF THE INVENTION

The present invention provides an interposer fabricating process and a wafer packaging structure formed by the interposer, wherein the interposer does not have through silicon vias therein and there is no need for adhesive between the interposer and attached components such as substrates, wafers or dies.

The present invention provides an interposer fabricating process including the following steps. A substrate, an oxide layer, and a dielectric layer are stacked from bottom to top, and an interconnect in the dielectric layer is provided, wherein the dielectric layer includes a stop layer contacting the oxide layer and the interconnect includes a metal structure having a barrier layer protruding from the stop layer. The substrate and the oxide layer are removed by a removing selectivity between the oxide layer and the stop layer until the stop layer and the barrier layer are exposed.

The present invention provides another interposer fabricating process including the following steps. A substrate, an oxide layer, a conductive layer and a dielectric layer are stacked from bottom to top, and an interconnect in the dielectric layer and contacting the conductive layer are provided. The substrate and the oxide layer are removed until the conductive layer is exposed.

The present invention provides a wafer packaging structure including a dielectric layer and an interconnect. The interconnect is disposed in the dielectric layer, wherein the dielectric layer is multi-layered, and the interconnect includes a metal structure and a first metal structure disposed in the same layer, wherein the metal structure protrudes from a back side of the dielectric layer but the first metal structure does not.

According to the above, the present invention provides an interposer fabricating process, which does not have through silicon vias in the interposer, and a wafer packaging structure formed by the interposer, wherein there is no need for adhesive between the interposer and attached components such as substrates, wafers or dies. The interposer includes a dielectric layer, which may be multi-layered, and an interconnect in the dielectric layer. The interconnect includes a metal structure and a first metal structure disposed in the same layer of the multi-layers. In one case, the metal structure protrudes from a back side of the dielectric layer but the first metal structure does not. In another embodiment, a conductive layer is further disposed on the back side of the dielectric layer, so that the metal structure and the first metal structure may both protrude through the dielectric layer and contact the conductive layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
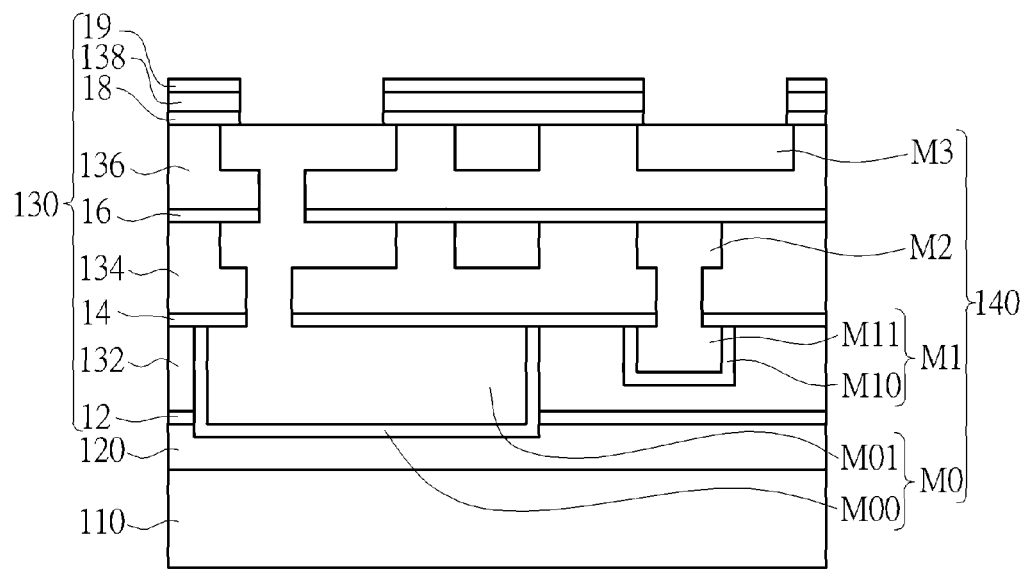
FIGS. 1-2 schematically depict a cross-sectional view of an interposer fabricating process according to an embodiment of the present invention.
Figure 2:
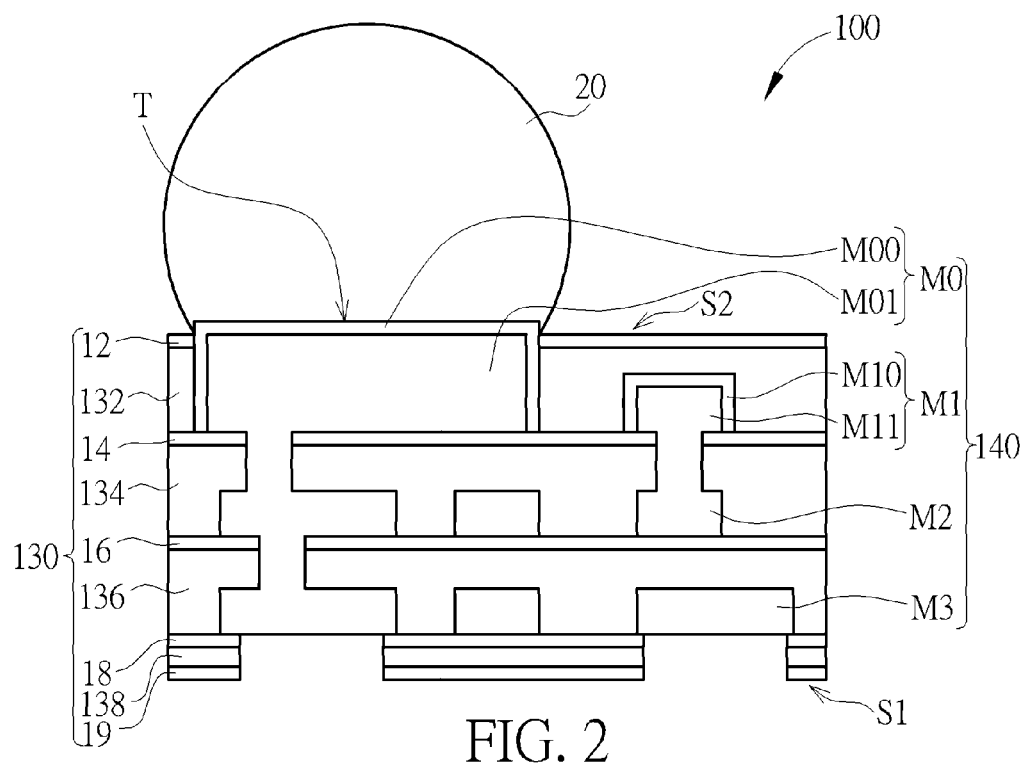

FIGS. 1-2 schematically depict a cross-sectional view of an interposer fabricating process according to an embodiment of the present invention. As shown in FIG. 1, a substrate 110, an oxide layer 120, and a dielectric layer 130 are stacked from bottom to top. The substrate 110 may be a silicon substrate or a silicon wafer, but is not limited thereto. The oxide layer may be formed on the substrate 110 by a thermal oxidation process or a chemical vapor deposition process, etc. The dielectric layer 130 is multi-layered and has an interconnect 140 disposed therein. In this embodiment, the dielectric layer 130 includes four dielectric layers sandwiched between five stop layers, respectively, and the interconnect 140 distributed in three of the dielectric layers, but is not limited thereto. In the present invention, an oxide layer may comprise one or more materials selected from TEOS (oxide formed from the precursor tetraethyl orthosilicate), USG (undoped silicate glass), PSG (phosphorous doped silicate glass), BPSG (borophospho silicate glass), low-k dielectric materials (dielectric materials with low dielectric constant), and a combination thereof.

A stop layer 12 is deposited on the oxide layer 120, and then a first dielectric layer 132 is deposited on the stop layer 12. In this embodiment, the stop layer 12 is a silicon nitride layer, silicon carbide or a silicon oxynitride layer while the first dielectric layer 132 is an oxide layer, but it is not limited thereto. Thereafter, only the first dielectric layer 132 is patterned by methods such as sequentially performing a lithography process and an etching process to form a first recess (not shown) for forming a first metal structure M1 in the first dielectric layer 132; then the first dielectric layer 132 and the stop layer 12 are patterned by methods such as sequentially performing a lithography process and an etching process to form a recess (not shown) for forming a metal structure M0 in the dielectric layer 130. In addition, the order of forming the first recess and the recess can be inverted, or the first recess and the recess may be formed at the same time.

A barrier layer (not shown) and a seeding layer (not shown) may be sequentially deposited to entirely cover the first recess, the recess and the first dielectric layer 132, wherein the barrier layer may be a single layer or a multi-layer structure composed of titanium (Ti), tantalum (Ta), tantalum nitride (TaN) or titanium nitride (TiN) etc., formed by a physical vapor deposition (PVD) process or a chemical vapor deposition (CVD), and the seeding layer may be composed of a metal such as copper, and formed by a physical vapor deposition (PVD) process or a plating process, but this is not limited thereto; a conductive material (not shown) such as copper is deposited by methods such as electroplating to fill the first recess and the recess; then, the conductive material, the seeding layer and the barrier layer may be planarized by a planarization process such as a chemical mechanical polishing (CMP) process until the first dielectric layer 132 is exposed, to form the first metal structure M1 and the metal structure M0, wherein the first metal structure M1 includes a barrier layer M10, a seeding layer (not shown) and a conductive material M11 while the metal structure M0 includes a barrier layer M00, a seeding layer (not shown) and a conductive material M01. It is emphasized that the metal structure M0 protrudes from the first dielectric layer 132 to contact with the oxide layer 120, but the first metal structure M1 is entirely within the first dielectric layer 132 without protruding from the stop layer 12.

A first stop layer 14 and a second dielectric layer 134 may be deposited on the first dielectric layer 132 by the same method used for forming the stop layer 12 and the first dielectric layer 132. The materials used for the first stop layer 14 and the second dielectric layer 134 are respectively similar to the materials used for the stop layer 12 and the first electric layer 132. A second metal structure M2 may be formed in the second dielectric layer 134 by the same method used for forming the first metal structure M1, and the second metal structure M2 electrically contacts the metal structure M0 and the first metal structure M1. The second metal structure M2 may also comprises a barrier layer, a seeding layer and a conductive material even though the barrier layer and the seeding layer are not shown in the FIG. 1. Likewise, a second stop layer 16, a third dielectric layer 136, a third stop layer 18, a fourth dielectric layer 138 and a fourth stop layer 19 may be deposited sequentially in the same way, and a third metal structure M3 may be formed in the third dielectric layer 136, wherein the third metal structure M2 electrically contacts the second metal structure M2 and is exposed by the third stop layer 18, the fourth dielectric layer 138 and the fourth stop layer 19.

The dielectric layer 130 including the first dielectric layer 132, the second dielectric layer 134, the third dielectric layer 136 and the fourth dielectric layer 138, and the interconnect 140 including the metal structure M0, the first metal structure M1, the second metal structure M2 and the third metal structure M3 are formed at this point. In this embodiment, the first dielectric layer 132, the second dielectric layer 134, the third dielectric layer 136 and the fourth dielectric layer 138 are all oxide layers while the stop layer 12, the first stop layer 14, the second stop layer 16, the third stop layer 18, and the fourth stop layer 19 are all silicon nitride layers, silicon carbide layers or silicon oxynitride layers; the metal structure M0, the first metal structure M1, the second metal structure M2 and the third metal structure M3 are all composed of a barrier layer, a seeding layer and copper, but are not limited thereto.

The substrate 110 and the oxide layer 120 are removed until the stop layer 12 and the barrier layer M00 are exposed, as shown in FIG. 2, meaning an interposer 100 including the dielectric layer 130 and the interconnect 140 is formed. In one case, the substrate 110 and the oxide layer 120 can be removed by a removing selectivity between the oxide layer 120 and the stop layer 12, so the substrate 110 and the oxide layer 120 are removed completely while the stop layer 12 and the barrier layer M00 are reserved. For example, the substrate 110 and the oxide layer may be sequentially removed by a polishing process and then a (wet) etching process; or, the substrate 110 and the oxide layer may be sequentially removed only by a polishing process or an etching process, depending upon the needs.

The dielectric layer 130 has a front side S1 and a corresponding back side S2. In one case, the interconnect 140 includes a redistribution layer, so components can be flexibly attached on either side of the dielectric layer 130 to be electrically connected through the interposer 100. Dies may be electrically connected to the interconnect 140 by a physical connection to the third metal structure M3 from the front side S1 of the dielectric layer 130. The metal structure M0 is exposed from the back side S2 of the dielectric layer 130, and a bump 20 may be directly bonded on the metal structure M0. The bumps 20 may be solder balls or conductors of other shapes. The number of the bumps 20 is not restricted to those shown in FIG. 2, and can depend upon practical requirements. Thus, the interposer 100 has no through silicon vias, and there is no adhesive between the interposer 100 and the dies, and between the interposer 100 and components connected by the bump 20.

In the embodiment of FIG. 2, the barrier layer M00 of the metal structure M0 protrudes from the back side S2 of the dielectric layer 130 and connects with the bump 20. Preferably, the barrier layer M00 has an inversely U-shaped cross-sectional profile with a bottom part T of the barrier layer M00 slightly higher than the back side S2 of the dielectric layer 130, thereby improving the connection between the bump 20 and the barrier layer M00.

Figure 3:
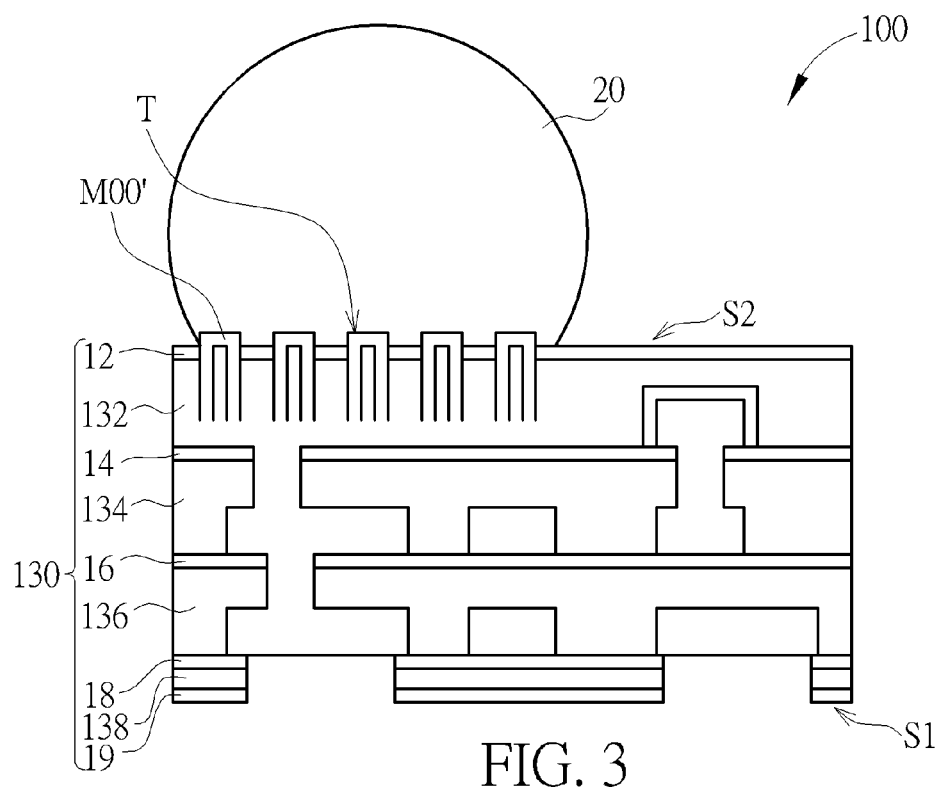
FIG. 3 schematically depicts a cross-sectional view of an interposer fabricating process according to another embodiment of the present invention.

In another embodiment, the barrier layer M00' may have a plurality of U-shaped cross-sectional profiles for helping the bump 20 to be inlaid into the gaps of the barrier layer M00', as shown in FIG. 3. As the barrier layer M00' has at least a divot such as at least a U-shaped cross-sectional profile, the connection between the bump 20 and the barrier layer M00' can be improved by having the bump 20 inlaid into the divot. The shape of the barrier layer M00' is not limited thereto, and depends upon processing or structural needs.

Accordingly, the embodiments of FIGS. 1-3 relate to structures and processes thereof, wherein each of these structures has a dielectric layer and an interconnect disposed in the dielectric layer. The dielectric layer is multi-layered, and may include a first dielectric layer, a second dielectric layer, a third dielectric layer and a fourth dielectric layer. The interconnect may include several metal structures such as a metal structure, a first metal structure, a second metal structure and a third metal structure, but the interconnect structure must have a metal structure and a first metal structure disposed in the same layer of the dielectric layer with the metal structure protruding from a back side of the dielectric layer but without the first metal structure protruding from the back side.

Figure 4:
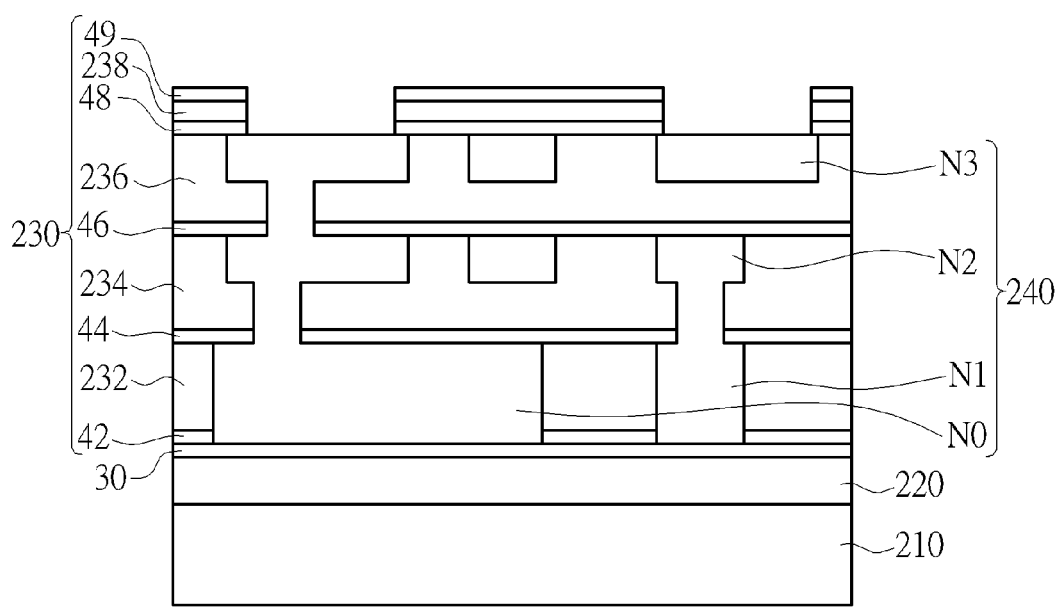
FIGS. 4-7 schematically depict a cross-sectional view of an interposer fabricating process according to another embodiment of the present invention.

Another interposer, which does not have through silicon vias therein and does not need adhesive for connecting to other devices, is presented in the following. FIGS. 4-7 schematically depict a cross-sectional view of an interposer fabricating process according to another embodiment of the present invention. As shown in FIG. 4, a substrate 210, an oxide layer 220, a conductive layer 30 and a dielectric layer 230 are stacked from bottom to top. The substrate 110 may be a silicon substrate or a silicon wafer, but it is not limited thereto. The oxide layer 220 may be formed on the substrate 110 by a thermal oxidation process or a chemical vapor deposition process etc. The conductive layer 30 may be an under bump metallization (UBM) layer, and may be composed of metals such as nickel, gold or copper, and may be formed by a physical vapor deposition (PVD) process, but it is not limited thereto.

The dielectric layer 230 is multi-layered having an interconnect 240 disposed therein. In this embodiment, the dielectric layer 230 includes four dielectric layers sandwiched between five stop layers respectively, and the interconnect 240 is distributed in three of the dielectric layers, but it is not limited thereto.

Moreover precisely, a stop layer 42 and a first dielectric layer 232 are deposited on the conductive layer 30 and the stop layer 42 and the first dielectric layer 232 are patterned by methods such as a lithography process and an etching process to form a recess (not shown) for forming a metal structure, and to form a first recess (not shown) for forming a first metal structure. In this embodiment, the stop layer 42 may be a silicon nitride layer, a silicon carbide layer or a silicon oxynitride layer etc. Then, a barrier layer (not shown) and a seeding layer (not shown) may cover the recess and the first recess optionally, and a conductive material (not shown) is filled into the recess and the first recess to form a metal structure N0 and a first metal structure N1 simultaneously. Since the conductive layer 30 is previously disposed between the oxide layer 220 and the first dielectric layer 232, the first metal structure N0 and the first metal structure N1 all go through the first dielectric layer 232 and contact the conductive layer 30.

Thereafter, a first stop layer 44 and a second dielectric layer 234 may be sequentially deposited on the first dielectric layer 232 by the same method used for forming the stop layer 42 and the first dielectric layer 232. The materials used for the first stop layer 44 and the second dielectric layer 234 are respectively similar to the materials used for the stop layer 42 and the first electric layer 232. A second metal structure M2 may be formed in the second dielectric layer 234 by the same method used for forming the metal structure N0 and the first metal structure N1, and the second metal structure M2 electrically contacts the metal structure N0 and the first metal structure N1. The second metal structure M2 may also comprises a barrier layer, a seeding layer and a conductive material even though the barrier layer and the seeding layer are not shown in the FIG. 4. Likewise, a second stop layer 46, a third dielectric layer 236, a third stop layer 48, a fourth dielectric layer 238 and a fourth stop layer 49 may be deposited sequentially in the same way as said methods, and a third metal structure N3 may be formed in the third dielectric layer 236, and electrically contacts the second metal structure N2 and is exposed by the third stop layer 48, the fourth dielectric layer 238 and the fourth stop layer 49.

Thus, the dielectric layer 230 including the first dielectric layer 232, the second dielectric layer 234, the third dielectric layer 236 and the fourth dielectric layer 238, and the interconnect 240 including the metal structure N0, the first metal structure N1, the second metal structure N2 and the third metal structure N3 are formed at this point. In this embodiment, the first dielectric layer 132, the second dielectric layer 134, the third dielectric layer 136 and the four dielectric layer 138 are all oxide layers while the stop layer 42, the first stop layer 44, the second stop layer 46 and the third stop layer 48, the four stop layer 49 are all silicon nitride layer, silicon carbide or silicon oxynitride; the metal structure N0, the first metal structure N1, the second metal structure N2 and the third metal structure N3 are all composed of copper or aluminum, but it is not limited thereto.

Figure 5:
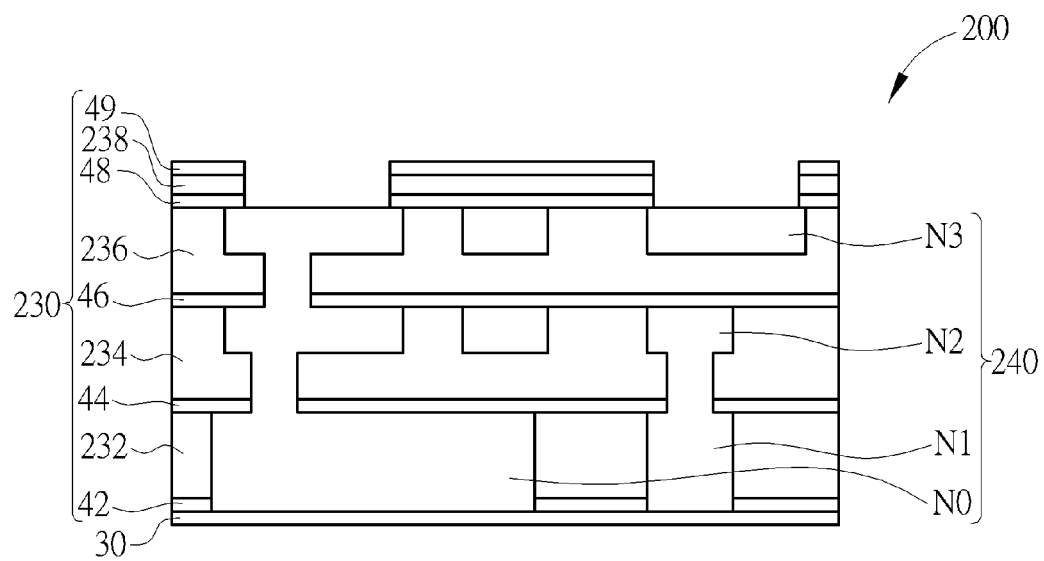

The substrate 210 and the oxide layer 220 are removed until the conductive layer 30 is exposed by using the conductive layer 30 as an etch stop layer, as shown in FIG. 5, meaning an interposer 200 including the dielectric layer 230, the interconnect 240 and the conductive layer 30 is formed. In one case, the substrate 210 and the oxide layer 220 may be sequentially removed by a polishing process, an etching process or a polishing process followed by an etching process, but not limited thereto.

Figure 6:
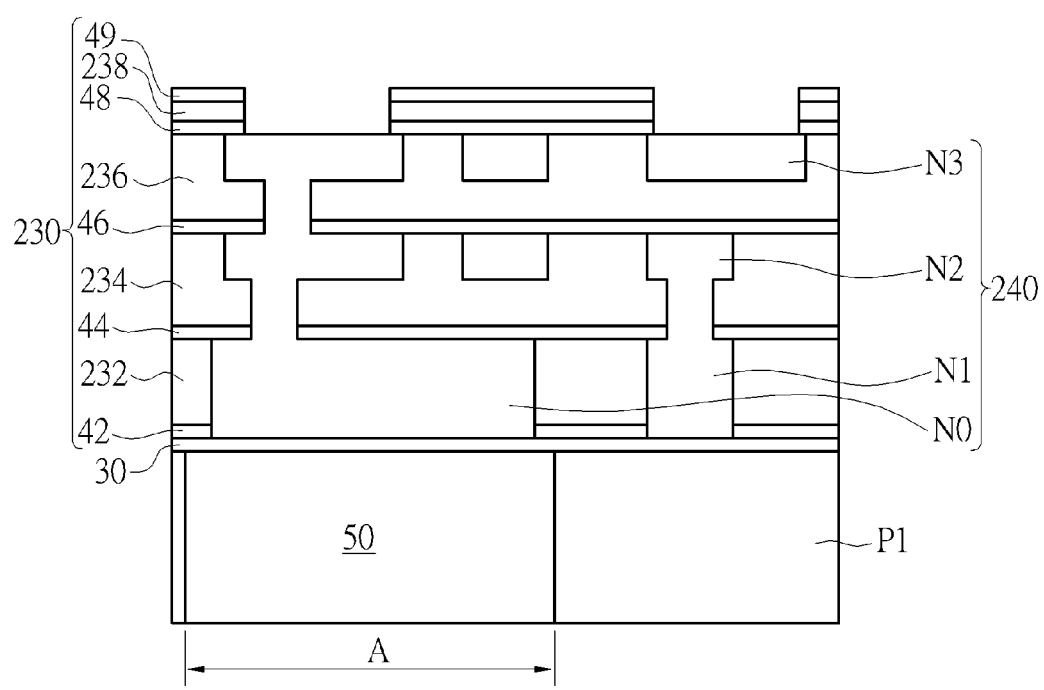
Figure 7:
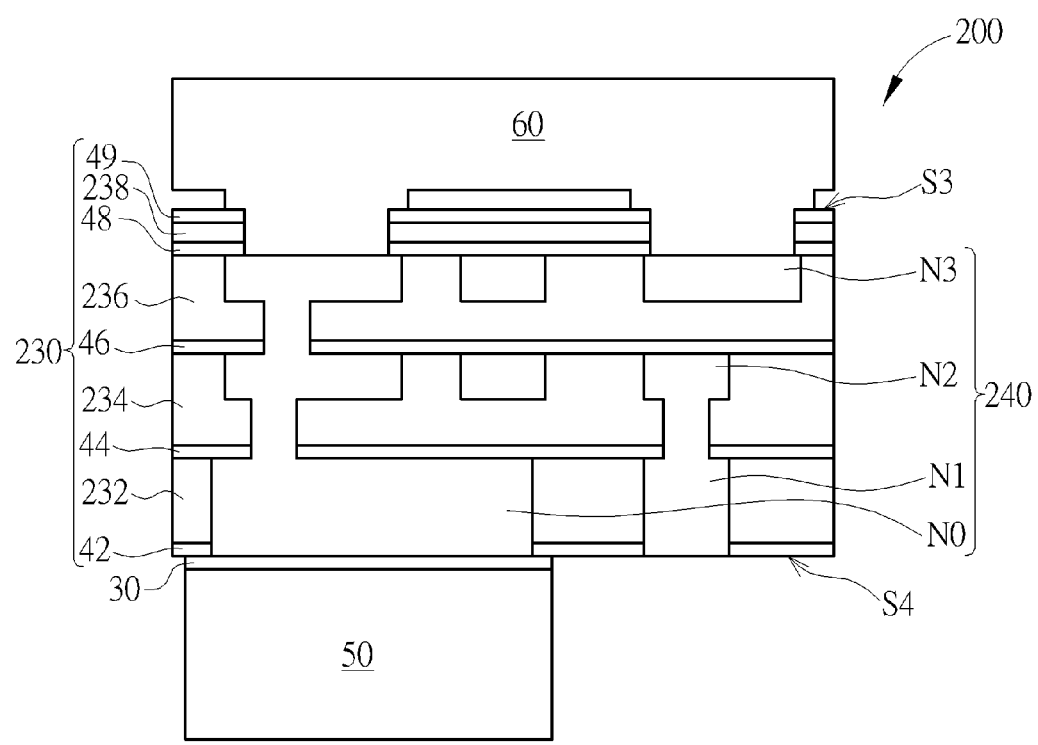

As shown in FIGS. 6-7, a bump 50 may be formed on a bumping area A of the conductive layer 30. More precisely, as shown in FIG. 6, a photoresist (not shown) may be formed and patterned to form a patterned photoresist P1 on the conductive layer 30 wherein the bumping area A is exposed. The bump 50 can be formed on the conductive layer 30 of the exposed bump area A by methods such as electroplating. Then, the patterned photoresist P1 and the conductive layer 30 other than the bumping area A may be removed, as shown in FIG. 7.

In this embodiment, the dielectric layer 230 has a front side S3 and a corresponding back side S4. The interconnect 240 includes a redistribution layer, allowing components to be flexibly attached on either side of the dielectric layer 230 and electrically connected through the interposer 200. A Die 60 may be electrically connected to the interconnect 240 by physical connection to the third metal structure N3 from the front side S3 of the dielectric layer 230. The metal structure N0 and the first metal structure N1 are all exposed from the back side S2 of the dielectric layer 130, and the bump 50 may be directly bonded on the metal structure N0. Thus, the interposer 200 does not have through silicon vias, and there is no adhesive between interposer 200 and the die 60, and between the interposer 200 and components connected by the bump 50.

The aforesaid embodiments of the interposers 100/200 can be applied to a wafer packaging structure. For instance, a wafer packaging structure is presented below, as shown in FIGS. 8-13, which schematically depict a cross-sectional view of a wafer package process according to an embodiment of the present invention.

Figure 8:
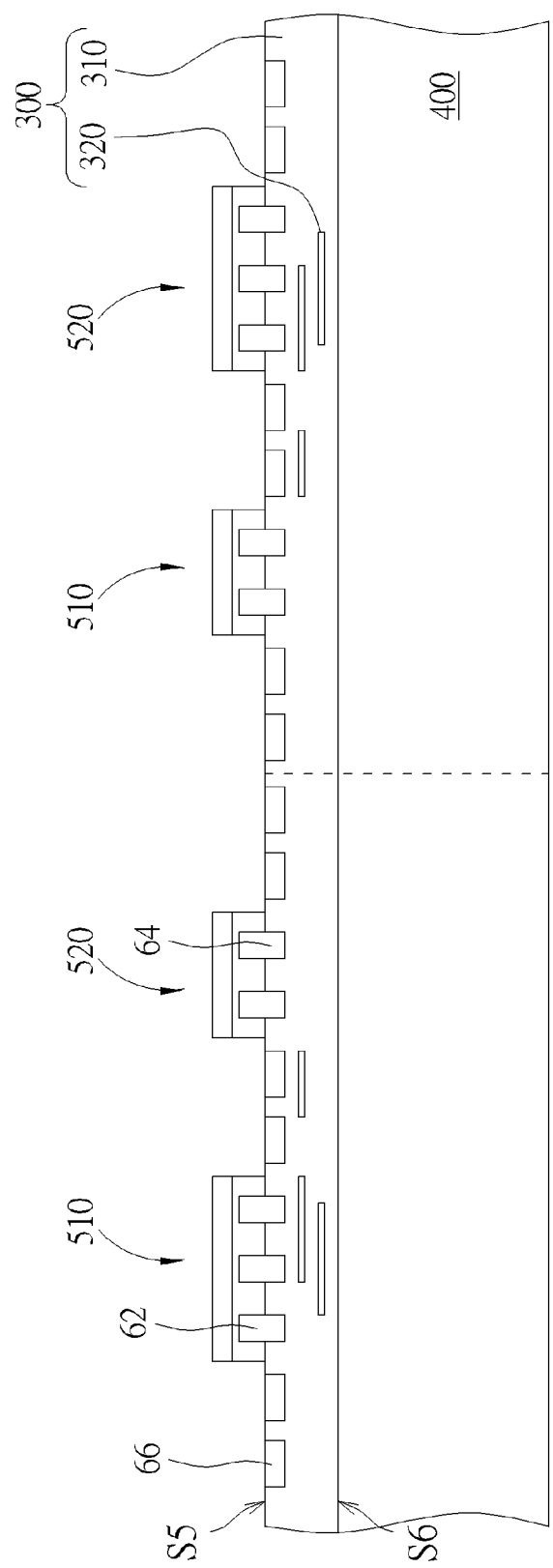
FIGS. 8-13 schematically depict a cross-sectional view of a wafer package process according to an embodiment of the present invention.

As shown in FIG. 8, an interposer 300 is formed on a substrate 400. An oxide layer (not shown) may be optionally formed between the interposer 300 and the substrate 400. The interposer 300 may be one of, or similar to, the aforesaid interposers 100/200 in the embodiments of FIGS. 1-2, FIG. 3 or FIGS. 4-7, thus the interposer 300 may include a dielectric layer 310 and an interconnect 320 in the dielectric layer 310. The dielectric layer 310 may be a multilayered structure while the interconnect 320 has several metal structures which include a redistribution layer and electrically connect devices such as dies, wafers, substrates or carriers, formed on either sides of the interposer 300. The substrate may include a silicon substrate or a silicon wafer. The dielectric layer 310 may include an oxide layer. The interconnect 320 may be composed of metals such as copper or aluminum.

The interposer 300 has a front side S5 and a back side S6. First dies 510 and second dies 520 may be bonded on the front side S5 of the interposer 300 by using flip chip technology. The sizes of the first dies 510 and the second dies 520 are smaller than the sizes of the interposer 300. The first dies 510 and the second dies 520 are bonded on the interposer 300 through an assembly process. The assembly process may include a Cu to Cu direct bonding process, a micro-bonding (μ-bonding) process or an oxide fusion bonding process, but is not limited thereto. Furthermore, the first dies 510 are bonded to the interposer 300 through bond pads 62 while the second dies 520 are bonded to the interposer 300 through bond pads 64. Each of the bond pads 62 may include a bonding pad on the first dies 510, a bonding pad on the interposer 300 and an optional solder bump. Each of the bond pads 64 may include a bonding pad on the second dies 520, a bonding pad on the interposer 300 and an optional solder bump. The interposer 300 may further include pond pads 66 which are exposed from the front side S5 of the interposer 300 for electrically connecting the interposer 300 with other components. In this embodiment, the first dies 510 and second dies 520 are bonded on the interposer 300 and the first dies 510 and second dies 520 are different functional dies, but not limited thereto. The number of dies bonded on the interposer 300 of the present invention is not restricted thereto. The types of devices bonded on the interposer 300 are not limited to dies.

Figure 9:
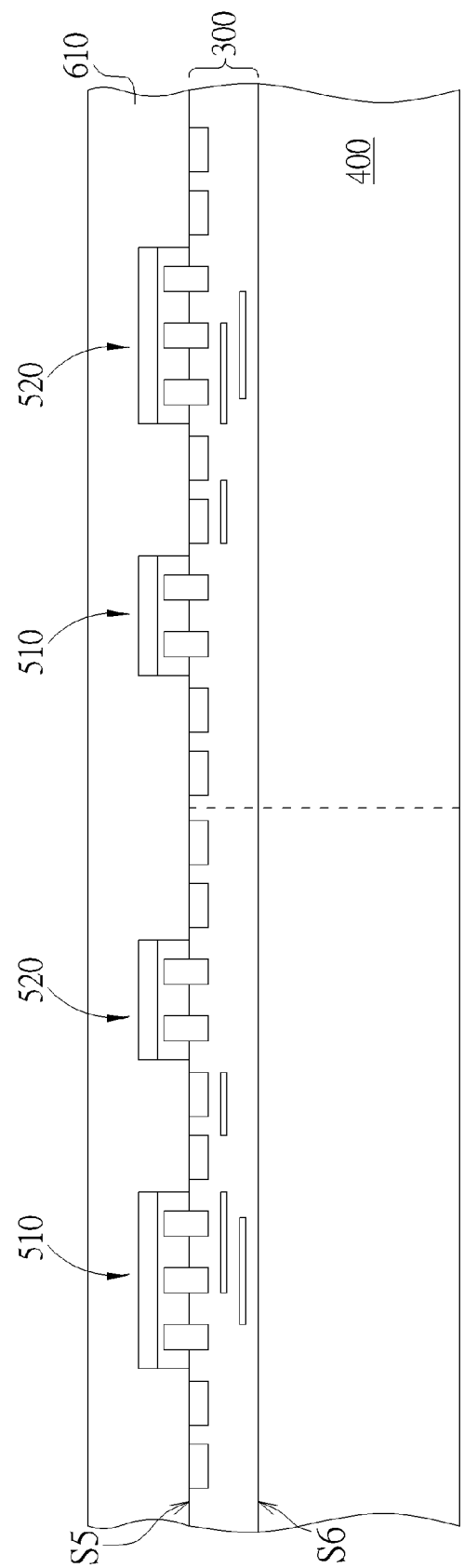
Figure 10:
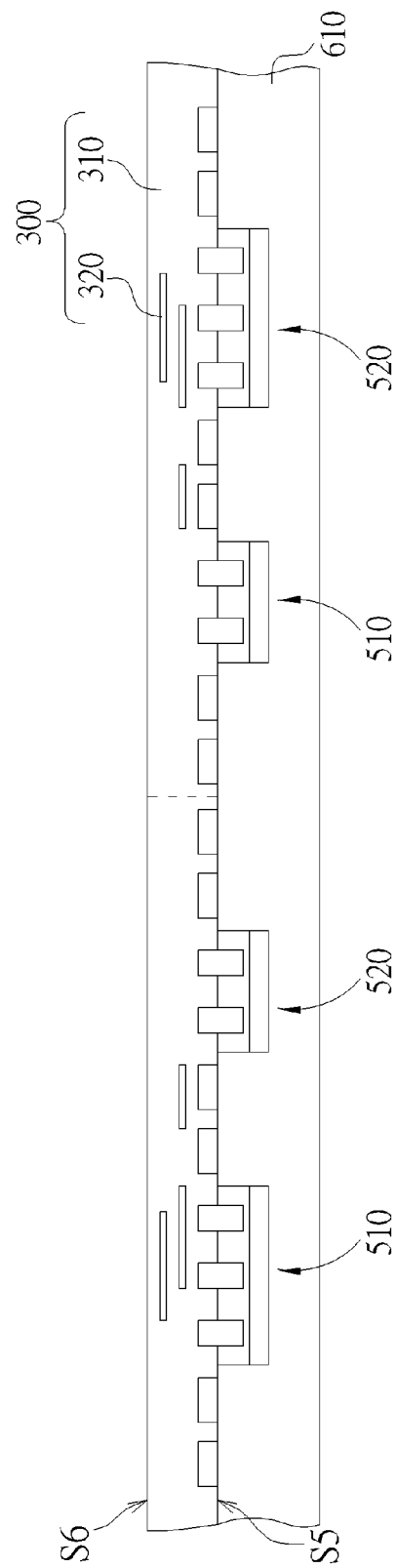

As shown in FIG. 9, a molding material 610 is formed to entirely cover the interposer 300, the first dies 510 and the second dies 520. The molding material 610 may include polymer or benzocyclobutene (BCB) etc., and the molding material 610 may be formed by processes such as coating, injection molding, extruding, but is not limited thereto. Thereafter, the substrate 400 is removed to expose the interposer 300 and the interposer 300 is inverted, as shown in FIG. 10. The substrate 400 may be removed by a polishing process. Furthermore, the substrate 400 may be removed by an etching process after the polishing process is performed. Preferably, the etching process is a wet etching process, and the etchant of the wet etching process may include ammonia, tetramethylammonium hydroxide (TMAH), but it is not limited thereto.

Figure 11:
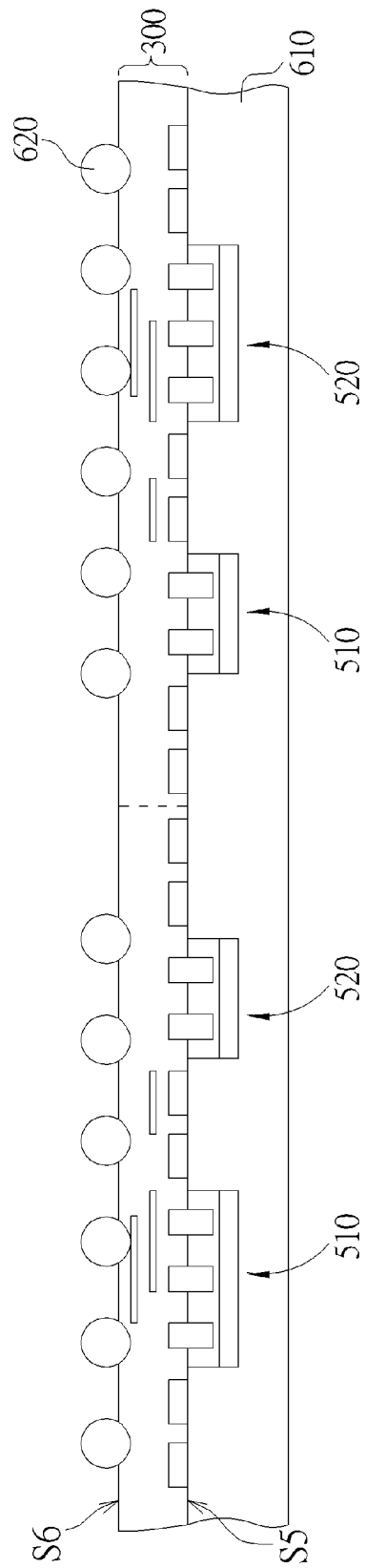

The interconnect 320 may be exposed while the substrate 400 is removed; or the interconnect 320 may be exposed by etching the dielectric layer 310 of the interposer 300 after the substrate 400 is removed, so that bumps 620 can be connected to the interconnect 320, as shown in FIG. 11. The bumps 620 may be solder balls or conductors of other shapes. The number of the bumps 620 is not restricted to those shown in FIG. 11, and can depend upon practical requirements.

Figure 12:
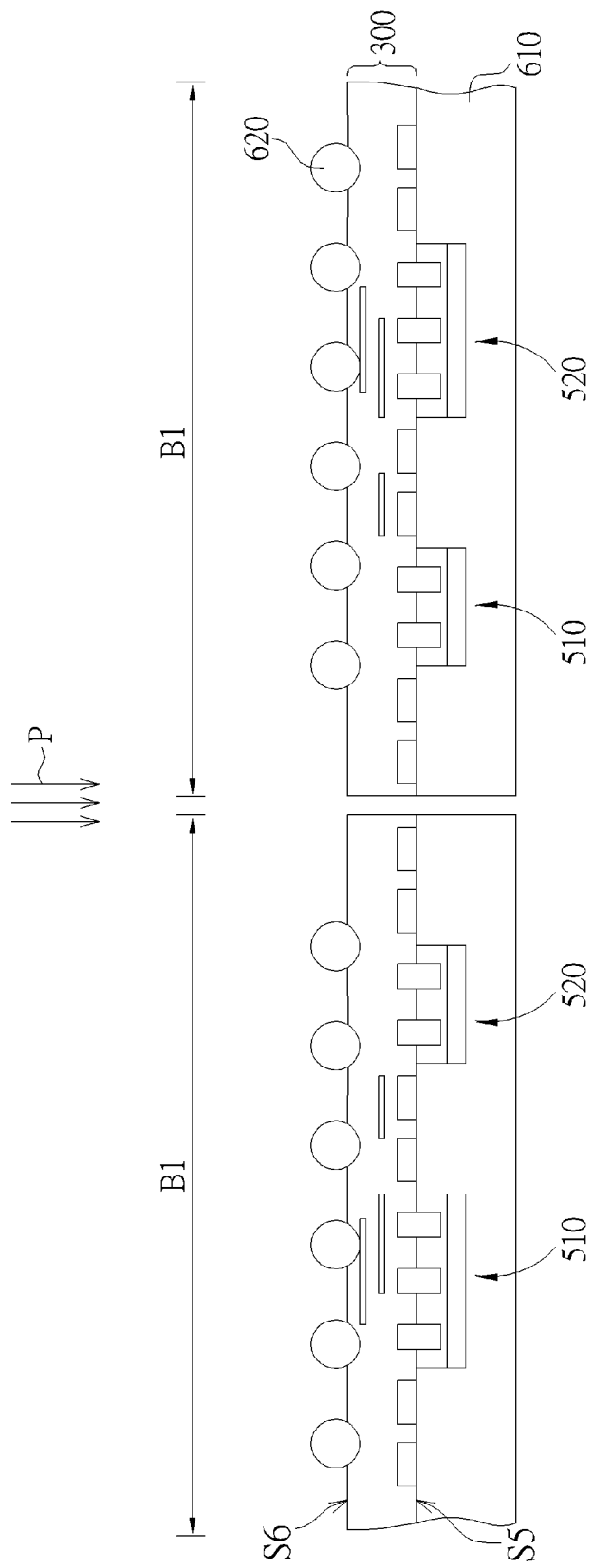

As shown in FIG. 12, a die sawing process P may be performed to separate the interposer 300 into many parts B1, B2. In this embodiment, the die sawing process P separates the interposer 300 into two same parts B1, B2, wherein each part B1, B2 has one of the first dies 510 paired with one of the second dies 520, but is not limited thereto. The two same parts B1, B2 individually constitute functional chips.

As shown in FIGS. 11-12, the bumps 620 are formed on the interposer 300, and the die sawing process P is performed. In another embodiment, however, the die sawing process P may be performed before the bumps 620 are formed on the interposer 300, depending upon requirements.

Figure 13:
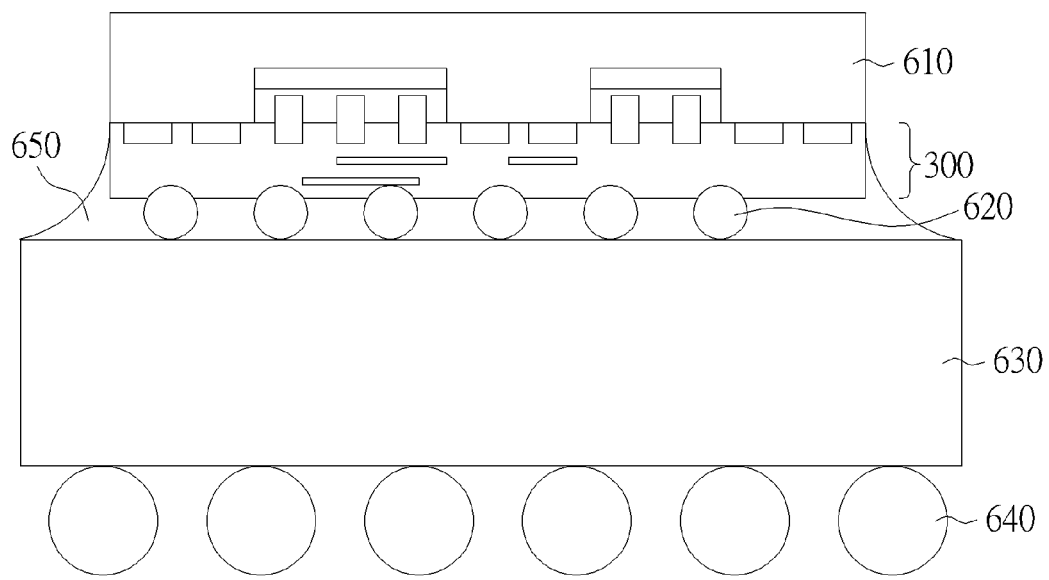

As shown in FIG. 13, one of the parts B1, B2 may be inversely disposed and bonded on a carrier 630 by using flip chip technology. The carrier 630 may be a PCB (printed circuit board), lead frame, chip, a loading plate, a substrate, or wafer. Furthermore, the carrier 630 may be attached using bumps 640 such as solder balls, which act as a terminal to electrically connect another device or circuit. This is not limited thereto. Glue 650 such as resin may optionally underfill the space between the parts B1, B2 and the carrier 630.

To summarize, the present invention provides an interposer fabricating process, which does not have through silicon vias in the interposer, and a wafer packaging structure formed by the interposer where there is no need for adhesive between the interposer and attached devices such as substrates, wafers or dies. The interposer only includes a dielectric layer, which may be multi-layered, and an interconnect in the dielectric layer. The interconnect includes a metal structure and a first metal structure disposed in the same layer of the multi-layers. In one case, the metal structure protrudes from a back side of the dielectric layer but the first metal structure does not. In another embodiment, a conductive layer is further disposed on the back side of the dielectric layer, so that the metal structure and the first metal structure all go through the dielectric layer and contact the conductive layer.

Furthermore, the metal structure may include a barrier layer, wherein the barrier layer protrudes from a back side of the dielectric layer. The barrier layer preferably has at least a divot, so that the connection between the interposer and devices such as dies, carriers or substrates can be improved by having bumps between the interposer and the devices filled into the divots of the barrier layer. The connection between the interposer and devices can be adjusted through designing the sizes, the shapes or the depths of the divots. For instance, the barrier layer may have at least a U-shaped cross-sectional profile, but it is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer packaging structure, comprising:
 a dielectric layer and an interconnect disposed in the dielectric layer, wherein the dielectric layer is multi-layered, and the interconnect comprises a metal structure and a first metal structure without vertically overlapping the metal structure disposed in a same layer of the multi-layered dielectric layer with the metal structure protruding from a back side of the dielectric layer but without the first metal structure protruding from the back side.

2. The wafer packaging structure according to claim 1, wherein the dielectric layer and the interconnect constitute an interposer.

3. The wafer packaging structure according to claim 1, further comprising:
 a bump connecting the metal structure protruding from the back side of the dielectric layer and a first die connecting the interconnect from a front side of the dielectric layer.

4. The wafer packaging structure according to claim 3, wherein the interposer does not have through silicon vias and adhesive.

5. The wafer packaging structure according to claim 1, wherein the metal structure comprises a barrier layer protruding from the back side of the dielectric layer.

6. The wafer packaging structure according to claim 5, wherein the barrier layer has at least a U-shaped cross-sectional profile.

7. The wafer packaging structure according to claim 6, wherein the U-shaped cross-sectional profile has a bottom part being exposed.

* * * * *